(12) United States Patent
Younis et al.

(10) Patent No.: US 6,448,914 B1
(45) Date of Patent: Sep. 10, 2002

(54) INTEGRATED CIRCUIT FOR CONDITIONING AND CONVERSION OF BI-DIRECTIONAL DISCRETE AND ANALOG SIGNALS

(75) Inventors: Mohamed Younis, Columbia, MD (US); James W. Ernst, Carmel, IN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/694,881

(22) Filed: Oct. 24, 2000

(51) Int. Cl.⁷ .................................................. H03M 1/00
(52) U.S. Cl. ........................ 341/141; 341/139; 341/108
(58) Field of Search ................................. 341/141, 155, 341/139, 108

(56) References Cited

U.S. PATENT DOCUMENTS

| | | | | |
|---|---|---|---|---|
| 3,805,242 A | * | 4/1974 | Matsumoto | 340/163 R |
| 4,704,676 A | * | 11/1987 | Flanagan et al. | 364/146 |
| 4,736,337 A | * | 4/1988 | Baba et al. | 364/900 |
| 4,742,515 A | * | 5/1988 | Dabholkar et al. | 341/141 |
| 5,995,033 A | * | 11/1999 | Roeckner et al. | 341/155 |

\* cited by examiner

Primary Examiner—Howard L. Williams
(74) Attorney, Agent, or Firm—Loria B. Yeadon

(57) ABSTRACT

An integrated circuit chip for interfacing a digital computer to sensors and controlled devices can be configured to accept and provide a variety of analog and discrete input and output signals. The circuit includes a plurality of signal conditioning cells, a plurality of signal conversion cells, and input and output signal multiplexors.

9 Claims, 3 Drawing Sheets

Signal Conditioning Cell
∼111

INTEGRATED CIRCUIT FOR CONDITIONING AND CONVERSION OF BI-DIRECTIONAL DISCRETE AND ANALOG SIGNALS

FIELD OF INVENTION

The present invention relates to the field of programmable input and output interfaces and in particular to an integrated circuit that can be programmed to accommodate various input/output signals with different characteristics at the same time and through the same interface.

BACKGROUND OF INVENTION

For any computer-controlled electrical system, the handling of input and output between components of the system is an important aspect of the system. An interface between components of a system can convert or condition an output signal from one component to become a compatible input signal in another component. This conversion or conditioning must be performed while maintaining the signal's integrity and accuracy.

Often, an input/output interface will have to coordinate input and output signals with extremely varied signal characteristics. For example, one component can have analog signals that need to be converted into digital signals in order to be analyzed by another component. In another instance, typical for aircraft, analog signals from one component can have a voltage range as great as (−15 to +28) volts while another component in the system has a voltage range of +/−5 millivolts. Other situations entail having components that utilize both differential and single-ended signals that have to be input to another component.

Given the wide variety of signal characteristics that can exist within a given system, input/output interface designs are typically developed to apply to a specific system. In particular, for systems on an aircraft, sensors on the aircraft can produce widely different output signals that have to be converted and conditioned in order to be processed by the aircraft computers. Typically, a different input/output interface is developed for every sensor to produce a digital stream of data readable by the aircraft computers.

Redesigning the input/output interface every time a new sensor is used wastes valuable time and money, as the designer must gain expertise with these sensors before designing the new interface. As such, there exists a need for a compact device that can be easily incorporated into a component system and programmable to handle a multitude of signals of varied characteristics to create a single standard interface between components of that system.

SUMMARY OF THE INVENTION

This invention comprises a configurable integrated circuit (IC) which is advantageously a single miniature chip to coordinate input and output (I/O) signals. The chip performs signal conditioning, analog-to-digital and digital-to-analog conversion. Both single-ended signals and differential signals can be handled at each channel of the chip. In addition, each channel is configurable to accept input signals or generate output signals. This invention enables the reuse of I/O hardware across multiple applications and reduces chip count, board space and connections and thus increases design reliability.

In one illustrative embodiment an input/output interface within a computer controlled electrical system comprises a plurality of signal conditioning cells to provide a physical interface for electrical signals in the system where each of the plurality of signal conditioning cells is capable of handling signals with different characteristics. A signal conversion cell connected to the signal conditioning cells is capable of converting each of the electrical signals on the plurality of channels to become a digital data value for the computer. The plurality of signals includes discrete signals, analog signals, differential signals, or single-ended signals.

DESCRIPTION OF THE INVENTION

Figure 1:
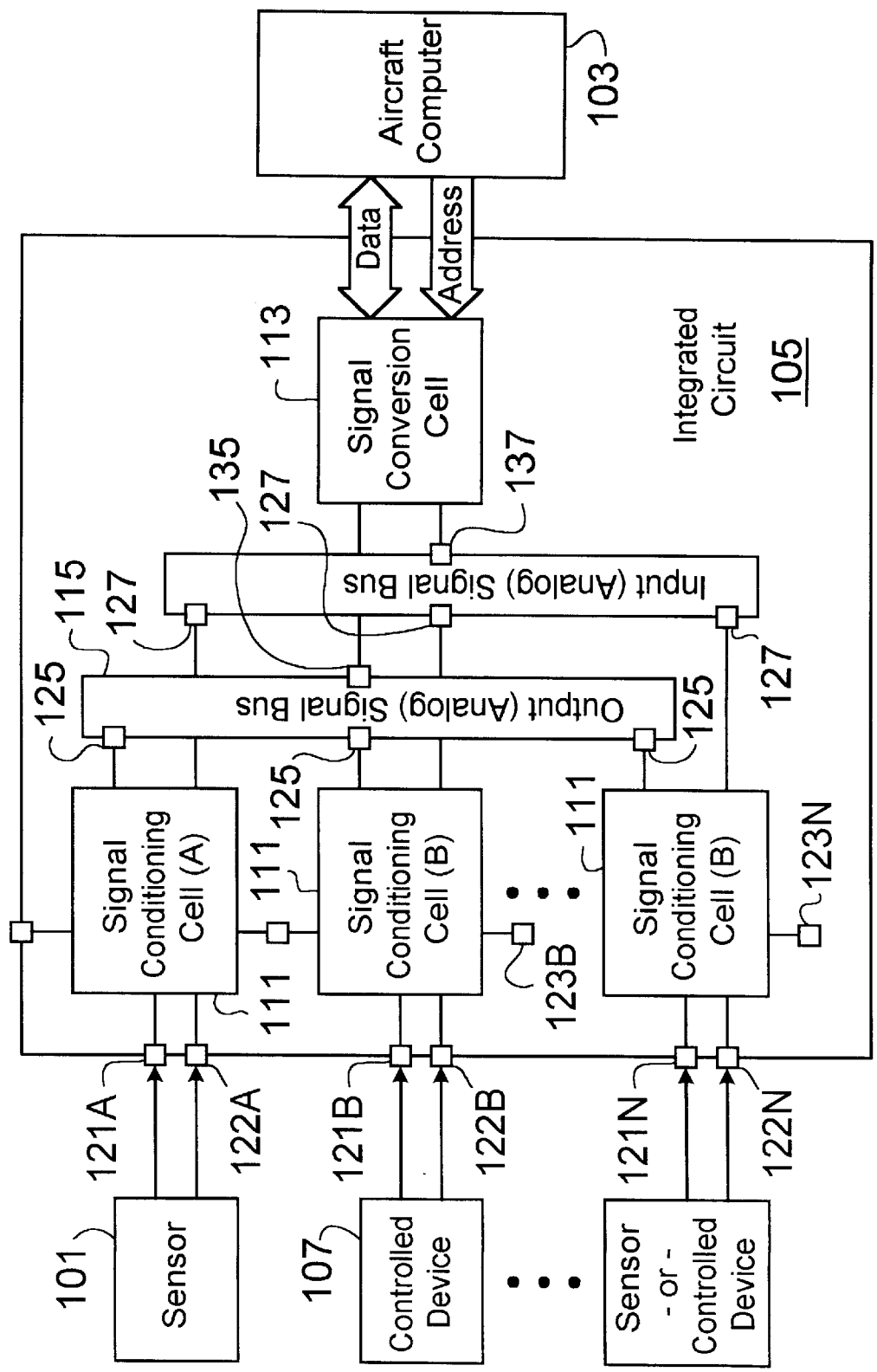
FIG. 1 depicts a generic block diagram of an aircraft computer interfacing with various sensors and controlled devices using an integrated circuit in accordance with an illustrative embodiment of our invention.

FIG. 1 depicts a typical aircraft system in which our invention may be employed. Sensors 101 on an aircraft produce continuously varying analog and or on-off discrete signals that need to be processed by the aircraft computer 103. Each sensor 101 can produce a signal that has different characteristics than other sensors because of the different types of sensors that are necessary to be on an aircraft. An integrated circuit 105 in accordance with our invention is interposed between the sensors 101 and the computer 103. The integrated circuit 105 can be installed in either the same line replaceable unit (LRU) as the aircraft computer or in a separate 'black box'. Each sensor 101 will transmit its signals to the integrated circuit 105 that conditions and converts the signals into a digital form that can be read by the aircraft computer 103. In turn, the aircraft computer 103 can send digital signals back to the integrated circuit 105. These signals will also be conditioned by the integrated circuit 105 and then transmitted to other controlled devices 107 on the aircraft.

FIG. 1 also depicts the layout of one illustrative embodiment of the integrated circuit 105 of our invention. The physical implementation of the integrated circuit 105 is advantageously embodied as a single semiconductor chip, but any other similar implementation can be used.

The integrated circuit 105 includes a number of signal conditioning cells (111A to 111N) that each provide pairs of physical leads (121A to 121N) and (122A to 122N) to physically connect the integrated circuit with the various types of signals within the component system. Each signal conditioning cell 111 can be configured by the aircraft computer 103 to condition a number of different signal types as described below. The signal conditioning cells (111) condition each input signal by buffering the input signal characteristics into standard signal characteristics, for example −10 volt to +10 volt, that can be converted by a shared analog to digital converter 303, shown in FIG. 3. The signal conditioning cells 111 condition each output signal by buffering a standard signal, for example −10 volt to +10 volt, that is provided by a shared digital to analog converter 325 shown in FIG. 3, into output signals with various signal characteristics. The signal conditioning cells 111 interface with a signal conversion cell 113 via an output multiplexor, for example a shared output analog signal bus 115 and an input multiplexor, for example a shared input analog signal bus 117. Signal conversion cell 113 includes registers that store digital values of the input and output signals and also configuration information for each of the signal conditioning cells 111. Signal conversion cell 113 also includes a sequencer and control module 343, shown in FIG. 3, which organizes the interaction among the various internal cells of the integrated circuit 105.

Figure 2:
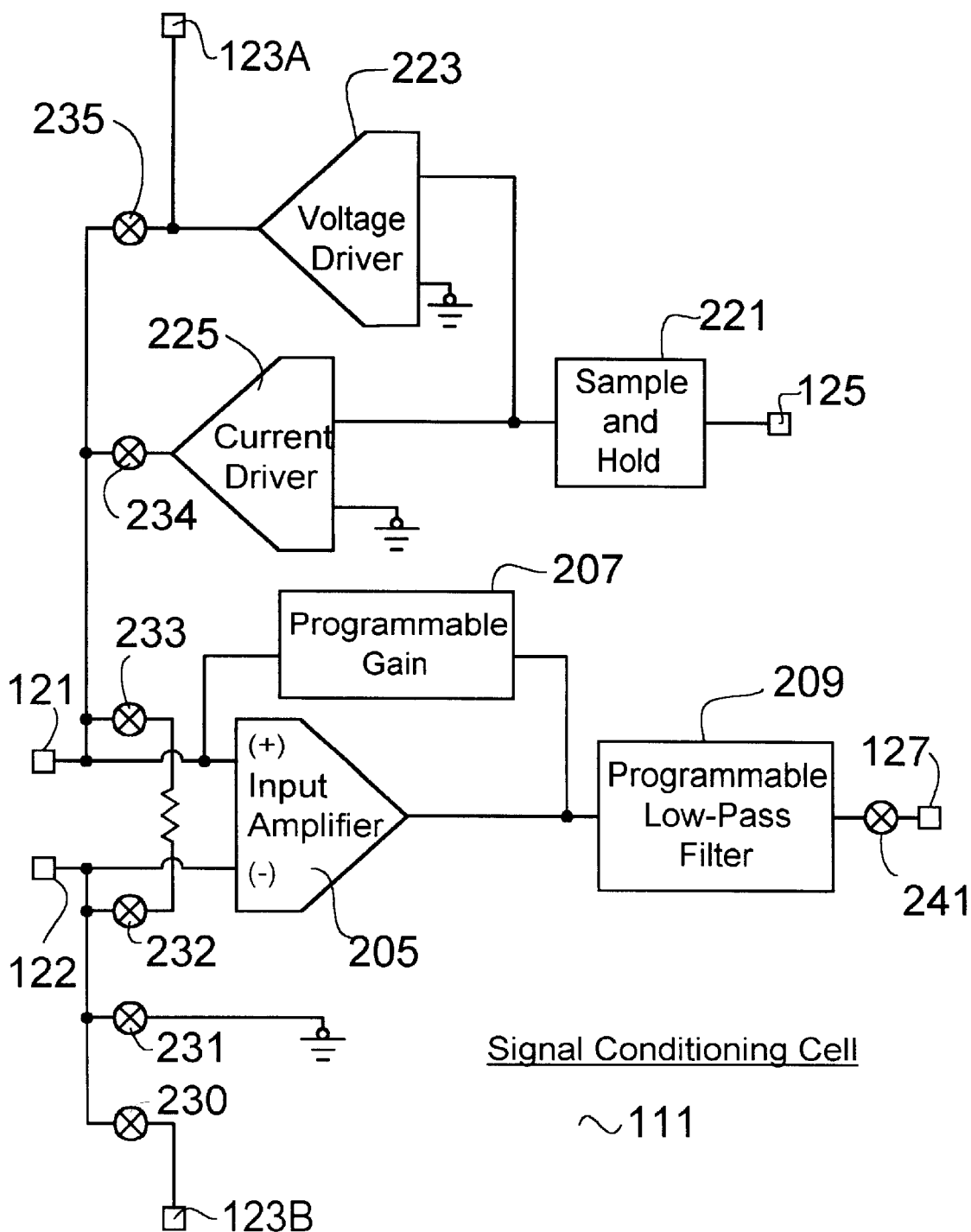
FIG. 2 is a circuit diagram of a single conditioning cell in accordance with one embodiment of our invention.

Advantageously, an integrated circuit in accordance with our invention is able to accommodate both input signals and output signals. FIG. 2 depicts a signal conditioning cell circuit that allows each channel to be programmed to accept input signals or produce output signals without affecting the signal. Physical leads 121 and 122 are connected to the inputs of an input amplifier 205 and connected through transmission gates to both a current driver 225 and a voltage driver 223. In one embodiment of the invention, the input amplifier 205 is an operational amplifier and the physical lead 121 is connected to its non-inverting (+) input and physical lead 122 is connected to its inverting (−) input. Sequencer and control module 343 controls the on-off setting of current driver transmission gate 234 based on values that the aircraft computer 103 has stored in the configuration register file 341, shown in FIG. 3. Sequencer and control module 343 controls the on-off setting of voltage driver transmission gate 235 based on values that the aircraft computer 103 has stored in the configuration register file 341. Voltage driver 223 can also be programmed to function as a common mode voltage reference for a adjacent signal conditioning cell 111 by supplying an output, for example to connection point 123A. When a signal conditioning cell is configured to receive an input, both the current driver transmission gate 234 and the voltage driver transmission gate 235 are set into high impedance states by the sequencer and control module 343, shown in FIG. 3.

When the signal on the signal-conditioning cell is to be output, the input operational amplifier 205 is still activated and will have no effect on the output signal. Having the input still activated while producing an output signal allows the invented system to be self-testing. Since the input is always connected to the final output, the input can be checked at any time to be certain that the output is functioning properly.

Referring again to FIG. 2, the physical leads 121 and 122 interfacing with the signal conditioning cell 111 of integrated circuit 105 are paired up to create one signal channel. Having two leads per signal channel is necessary in order to be able to accommodate both differential signals and single-ended signals. In addition to providing the physical leads, the signal conditioning cell 105 implements circuitry to be able to handle a number of different signal types. Input amplifier 205 buffers input voltage signals. Load resistor 201 is connected across physical leads 121 and 122 via transmission gates 232 and 233 to convert input current signals into a voltage input for input amplifier 205. In one embodiment of our invention, transmission gates 232 and 233 are field effect transistors (FET) with "on" impedance of 190 ohms and load resistor 201 has a value of 620 ohms. Sequencer and control module 343 controls the on-off setting of transmission gates 232 and 232 based on values that the aircraft computer 103 has stored in the configuration register file 341, shown in FIG. 3.

When the signal conditioning cell 105 is producing an output signal on physical leads 121 and 122, this output signal is wrapped back for built-in test purposes and monitored as an additional input signal. All input signals are treated as differential signal inputs. In instances where a single-ended signal is utilized, for example by an aircraft sensor, each signal conditioning cell 105 has a transmission gate 231 that allows one of the physical leads to be connected to a common ground point and an input 123, also shown in FIG. 1, that allows another signal conditioning cell to provide a common mode voltage reference. By having two leads for the differential signal, the differential signal keeps its integrity and the single-ended signal has a reference to its local ground. Discrete signals are treated as single-ended analog signals thereby adding the benefits of programmable hysteresis and programmable debounce.

Referring to FIG. 1, signal conversion cell 113 will either receive the input signals from or transmit an output signal to each signal-conditioning cell (111A to 111N). Referring back to FIG. 3, for input signals from the signal selection module, The input operational amplifier 205 scales the signal to the full range supported by an analog to digital converter 303, shown in FIG. 3, while maintaining signal integrity and accuracy. A programmable gain module 207 is connected across the non-inverting input of input operational amplifier 205. In one embodiment, the programmable gain module 207 is implemented as a system of resistors in parallel with transmission gates to switch them in or out of the circuit and vary the feedback resistance to determine the total gain according to the following formula:

$$V_{OUT} = \frac{R_{Feedback}}{R_{Input}} * V_{Input} \qquad \text{Eq. (1)}$$

The scaling step of the input operational amplifier 205 produces the maximum resolution for a number of signal ranges using a single range converter. For example, the scaling range for the signals should be able to handle ranges, typically found in aircraft, as great as −15V to 28V signals.

The signal can also be filtered through optional programmable low-pass filter 209 after passing the input operational amplifier 205. The filtering of the signal is used mainly as an anti-aliasing low pass filter that can be implemented by a switched capacitor network.

Advantageously, our invention includes an input signal multiplexor. For example, after the signal optionally passes through the filter 209, it is routed into a multiplex transmission gate 241, which selectively determines when the signal is connected to the input analog signal bus 117 at connection point 127, as shown in FIG. 1.

For output signals, either the current driver 225 or the voltage driver 223 can be enabled. The voltage driver 223 amplifies the voltage at a variable gain similar to the input operational amplifier 205. The current driver 225 has a set number of currents that can be selected when programmed. Output signals from both the current drivers and voltage drivers are presumed to be single-ended and reference to a local ground is provided as a signal return. An embodiment of the present invention to produce a differential signal uses two separate channels whereby one channel carries the true signal and the other carries the negative signal.

Figure 3:
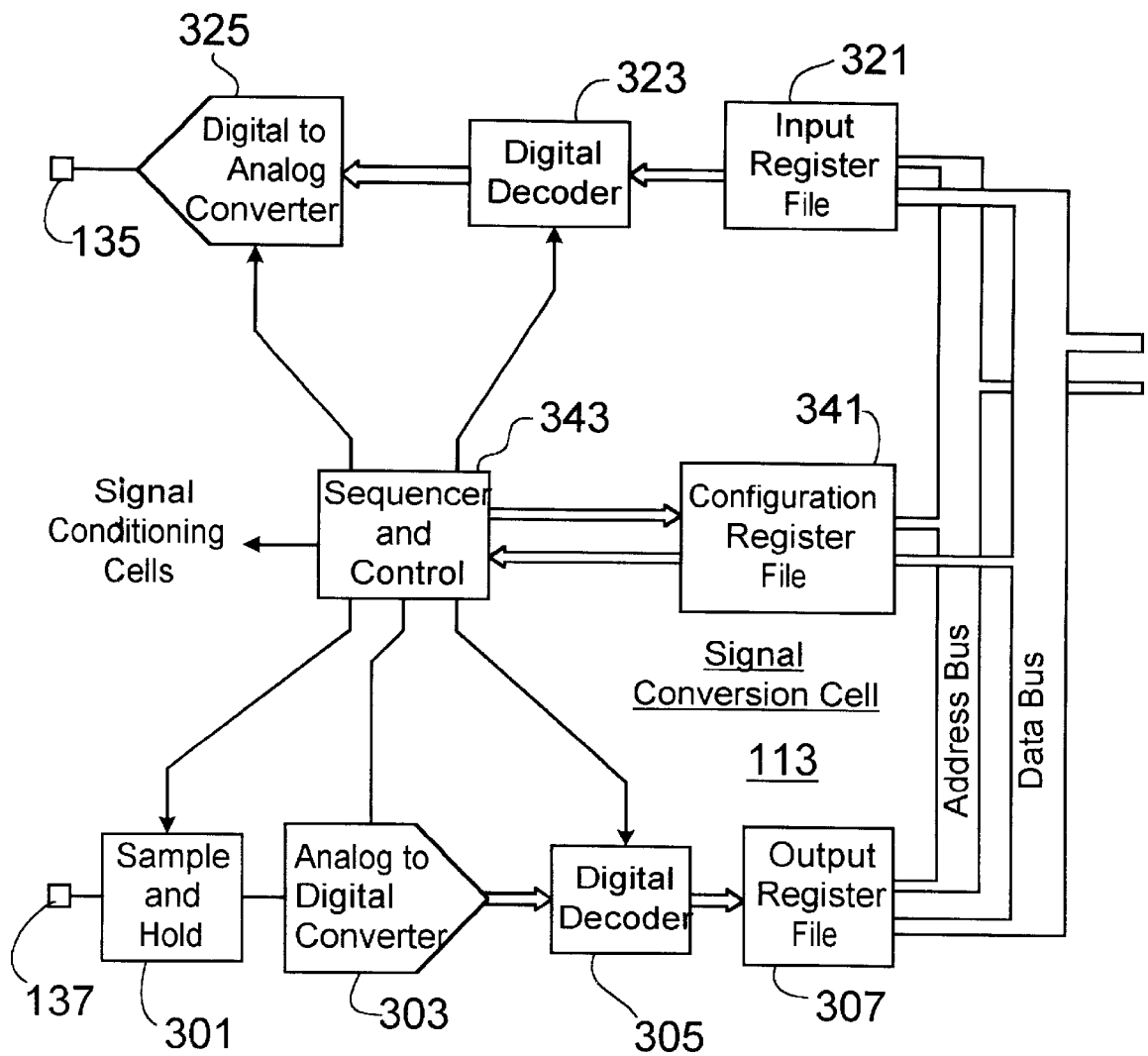
FIG. 3 is a circuit diagram of a single conversion cell in accordance with one embodiment of our invention.

FIG. 3 depicts the several components of the signal-conversion cell 113. Before transmitting the input signal to the analog to digital converter module 303, the signal conversion cell uses an input signal multiplexor, for example an input analog signal bus 117, shown in FIG. 1, and a sample and hold module 301 to prepare the various analog input signals to be converted by the converter module 303. Input analog signal bus 117 is connected to each signal-conditioning cell 111 of the integrated circuit 105.

In one embodiment of the input signal multiplexor of our invention, the sequencer and control module 343 routes analog data from a selected signal-conditioning cell 111 by activating the multiplex transmission gate 241, shown in FIG. 2, in that particular cell. The selected signal is routed from connection point 127, via the input analog signal bus 117 and connection point 137 to the input of a sample and hold module 301. Sample and hold module 301 will sample a given signal and will hold the signal's analog value to ensure that a stable unchanging signal is available to an analog to digital converter 303. The analog to digital converter 303 must have a stable analog input signal to ensure that proper conversion occurs. Analog to digital converters 303 convert the various analog signals to digital values. In one embodiment, the analog to digital converter has twelve bit precision.

A digital decoder 305 is used to map the various digital signals, after conversion to digital format, to input register file 307 at an address corresponding to the appropriate signal conditioning cell 111. When the data to be latched is placed on a bus that feeds to the register file, the address of the selected register is fed into the decoder by the sequencer and controller 343. The decoder sends a signal to the selected register's enable, and the data is latched into that register.

The digital signals are first transmitted to a digital decoder 323 that parses out the digital signals from the input register file 321. The digital decoder 323 ensures that only one output value at a time, stored in the registers is routed to the digital to analog converter 325. When the address of the selected register is fed into the decoder 323, the selected signal input is routed to the converter 325.

After digital to analog converter 325 converts the signal from a digital format to an analog format, the signal is routed via connection point 135 to an output signal multiplexor, for example the ,output analog signal bus, shown in FIG. 1, and to each signal conditioning cell at connection point 125. The sequencer and control module 343 then asserts a digital signal to the sample and hold module 221 of the selected signal conditioning cell (111A to 111N) that will then hold the analog signal value present on the output analog signal bus.

Advantageously, the combination of transmission gates 241, an analog input analog signal bus 117, a sample and hold module 301 and a digital decoder 305 for the input path and the corresponding combination of digital decoder 323, output analog signal bus 115, and sample and hold modules 221 for the output path allow a reduction in the amount of analog to digital converters 303 and digital to analog converters 325 utilized, which saves space in the compact general purpose interface integrated circuit 105. Instead of implementing a separate converter for each physical input/output channel, the signals are multiplexed and controlled to allow one converter to be used for multiple channels.

From the internal registers of the converters, the data is placed or taken from the integrated circuit's register files 307 and 321. The register files 307 represent the interface to the chip from the computer 103. Three groups of register files are needed for input data, output data and configuration data. The number of registers per file depends on the number of signals the chip is designed to handle. The size of each register depends on the accuracy of the conversion logic. For twelve-bit precision, a register with twelve-bit memory capacity is needed.

Reading the input register file can access values associated with samples of input signals. The aircraft computer will be able to access the information from the sensors 101 by accessing these input registers. To output information through the invented system, the aircraft computer 103 can write the data to the output register file.

Advantageously, the double-buffering system described above using aircraft computer internal system files and the interface register files of the present invention is useful for a synchronous access to the chip to ensure stability of the sampled values before processing them or being read out of the chip. A further embodiment of our invention allows the aircraft computer to also directly access the analog to digital converter's registers and the digital to analog converter's registers.

The configuration register file 341 stores the gain and type of conditioning for each signal. Using the values stored in the configuration file register, the sequencer and control module 343 can organize the interaction among the internal modules and handle the mapping of the internal registers of the converters. The sequencer and control module 343 can also reconfigure the modules and control access to input register file 321 and output register file 307. The sequencer and control module 343 ensures the correct order of internal operations and the synchronization of the input and output data streams.

The present invention is not to be considered limited in scope by the preferred embodiments described in the specification. Additional advantages and modifications, which will readily occur to those skilled in the art from consideration of the specification and practice of the invention, are intended to be within the scope and spirit of the following claims.

What is claimed is:

1. An integrated circuit providing a general purpose interface within an electrical system ands capable of accepting electrical input signals with various characteristics and providing electrical output signals with various characteristics, said integrated circuit comprising:

a plurality of signal conditioning cells each capable of accepting said input electrical signals with various characteristics and providing said output electrical signals with various characteristics and each comprising a pair of physical leads, an input conditioning circuit connected to said pair of physical leads and capable of buffering said input electrical signals of various characteristics into an input electrical signal with standard characteristics, and an output conditioning circuit capable of buffering an output electrical signal with standard characteristics into electrical signals with various characteristics and including a voltage driver, a current driver, and transmission gates connecting said voltage and said current drivers to said physical leads;

a signal conversion cell connected to each of said plurality of signal conditioning cells and comprising an analog to digital conversion circuit for converting said input electrical signals with standard characteristics into a plurality of input digital values, a digital to analog conversion circuit for converting a plurality of output digital values into output electrical signals with standard characteristics, a plurality of registers accessible by an external computer, said registers storing digital values, and decoders to map said digital values to addresses from said registers corresponding to particular ones of said signal conditioning cells, and a sequencer and control circuit for coordinating operations in said integrated circuit;

an input signal multiplexor comprising an analog input signal bus and a plurality of transmission gates, each connected between one of said signal conditioning cells and said input signal bus; and an output signal multiplexor comprising an analog signal output bus and a sample and hold circuit connected between each of said signal conditioning cells and said analog output signal bus.

2. The integrated circuit of claim 1 wherein said input signal multiplexor further comprises an input sample and hold circuit interposed between said analog input signal bus and said analog to digital conversion circuit of said signal conversion cell.

3. The integrated circuit of claim 1 wherein said voltage driver has an input and an output, said current driver has an input and an output with the input of said current driver being connected to the input of said voltage driver, and said transmission gates connect the outputs of said voltage and current drivers to said physical leads.

4. The integrated circuit of claim 1 wherein said output signal multiplexor further comprises a plurality of sample and hold circuits interposed between said analog signal output bus and said inputs of said voltage and current drivers.

5. The integrated circuit of claim 1 wherein one of said registers is an input register to store input digital values of said analog to digital conversion circuit and one of said decoders is an input digital decoder to map input digital values to an address in said input register corresponding to a particular one of said signal conditioning cells.

6. The integrated circuit of claim 1 wherein one of said registers is an output register to store output digital values and one of said decoders is an output digital decoder to map said output digital values from an address in said output register corresponding to a particular one of said signal conditioning cells to said digital to analog conversion circuit.

7. The integrated circuit of claim 1 further comprising a configuration register accessible by an external computer and storing a set of configuration data associated with the input and output electrical signals with various characteristics, said sequence and control circuit coordinating operations in said integrated circuit based on the configuration data stored in said configuration register.

8. The integrated circuit of claim 1, each said input conditioning circuit comprising an input amplifier to buffer said input electrical signals and including a first input, a second input, and an output, a load resistor that can be selectively switched across the first input and the second input of said input amplifier as required to convert an input current electrical signal into a voltage level input for said input amplifier, and a programmable gain module capable of adjusting voltage levels of said input electrical signals with various characteristics into standard characteristic voltage levels.

9. The integrated circuit of claim 1, wherein said input conditioning circuit of said signal-conditioning cell further comprises:

(a) a programmable low pass filter connected to the output of said input amplifier.

* * * * *

UNITED STATES PATENT AND TRADEMARK OFFICE
CERTIFICATE OF CORRECTION

PATENT NO. : 6,448,914 B1 Page 1 of 1
APPLICATION NO. : 09/694881
DATED : September 10, 2002
INVENTOR(S) : Younis et al.

It is certified that error appears in the above-identified patent and that said Letters Patent is hereby corrected as shown below:

In Claim 1, Column 6, Line 28, please replace "ands" with --and--

In Claim 9, Column 8, Line 24, please insert "each" after "wherein"

In Claim 9, Column 8, Line 25, please replace "said" with --a--

Signed and Sealed this

Twenty-fifth Day of December, 2007

JON W. DUDAS
*Director of the United States Patent and Trademark Office*